United States Patent [19]
Heideman et al.

[11] Patent Number: 5,369,300
[45] Date of Patent: Nov. 29, 1994

[54] MULTILAYER METALLIZATION FOR SILICON SEMICONDUCTOR DEVICES INCLUDING A DIFFUSION BARRIER FORMED OF AMORPHOUS TUNGSTEN/SILICON

[75] Inventors: Robert J. Heideman, Galveston; Randy A. Rusch; Michael S. Baird, both of Kokomo, all of Ind.

[73] Assignee: Delco Electronics Corporation, Kokomo, Ind.

[21] Appl. No.: 75,182

[22] Filed: Jun. 10, 1993

[51] Int. Cl.$^5$ .................. H01L 23/48; H01L 29/46; H01L 29/62; H01L 29/64
[52] U.S. Cl. .................. 257/651; 257/768; 257/770; 257/763; 257/767
[58] Field of Search .............. 257/763, 764, 765, 771, 257/751, 646, 770, 768, 767

[56] References Cited

U.S. PATENT DOCUMENTS

| | | | |
|---|---|---|---|
| 3,465,211 | 9/1969 | Adams | 317/234 |
| 3,906,540 | 9/1975 | Hollins | 357/15 |
| 4,188,636 | 2/1980 | Sato et al. | 357/71 |
| 4,350,994 | 9/1982 | Perepezko et al. | 357/67 |
| 4,494,136 | 1/1985 | Perepezko et al. | 357/67 |
| 4,564,395 | 1/1986 | Mori et al. | 148/4 |
| 4,626,448 | 12/1986 | Hays | 427/39 |
| 4,630,094 | 12/1986 | Wiley et al. | 357/67 |
| 4,737,474 | 4/1988 | Price et al. | 437/200 |
| 4,965,656 | 10/1990 | Koubuchi et al. | 257/764 |
| 5,136,361 | 8/1992 | Wollesen et al. | 257/52 |

OTHER PUBLICATIONS

M. A. Nicolet, I. Suni and M. Finetti, "Amorphous Metallic Alloys in Semiconductor Contact Metallizations", *Solid State Technology*, pp. 129–133 (Dec. 1983).
David R. McLachlan, "Refractory metals Diffusion Barriers", in the undated publication by Mterials Research Corporation in which its lists McLachlin as Technical Director, Advanced Materials Division. The front page of this paper states 34th and 35th Sputter Schools, Rome, Italy Jun., 1984, Santa Barbara, Calif., Nov. 1984.
F. W. Saris, L. S. Hung, M. Nastasi, and J. W. Mayer, and B. Whitehead, "Failure temperature of amorphous Cu-Ta alloys as diffusion barriers in Al-Si contacts", *Appl. Phys. Lett.*, vol. 46, No. 7, pp. 646–648 (1 Apr. 1985). All authors are from Cornell University, Ithaca, N.Y. 14853. Text for this paper was originally received 10 Jan. 1985.
L. S. Hung, F. W. Saris, S. Q. Wang, and J. W. Mayer, "Interactions of amorphous alloys with Si substrates and Al overlayers", *J. Appl. Phys.* vol. 59, No. 7, pp. 2416–2421 (1 Apr. 1986). The paper was originally received for publication 17 Sep. 1985. All of the authors are from the Department of Materials Science and Engineering, Cornell University, Ithaca, N.Y. 14853.
R. E. Thomas, J. H. Perepezko and J. D. Wiley, "Crystallization of Sputter Deposited Amorphous Metal Thin Films", *Applied Surface Science*, vol. 26, pp. 534–541 (1986) (Authors are from the Materials Science Center, University of Wisconsin—Madison, Madison, Wis. 53706, USA; Publisher received text 4 Jun. 1986).
L. S. Hung, E. G. Colgan, and J. W. Mayer, "Amorphous diffusion barriers in Al-Si and Au-Si contacts", *J. Appl. Phys.* vol. 60, No. 12, pp. 4177–4181 (15 Dec.

(List continued on next page.)

Primary Examiner—Andrew J. James
Assistant Examiner—S. V. Clark
Attorney, Agent, or Firm—Cary W. Brooks; Jimmy L. Funke

[57] ABSTRACT

A semiconductor device aluminum-containing metallization system that is particularly useful for integrated circuits (ICs) having P-type contact regions and also having a likelihood of extended exposure to elevated temperatures. Use of an aluminum/silicon diffusion barrier formed of an amorphous tungsten/silicon on such ICs is made commercially practical. A titanium or transition metal silicide layer is disposed beneath the amorphous tungsten/silicon layer, to consistently provide durable low resistance electrical contacts to P-type regions of the IC.

7 Claims, 1 Drawing Sheet

OTHER PUBLICATIONS 1986) (Authors are from the Department of Materials Science and Engineering, Cornell University, Ithaca, N.Y. 14853; the text was received by the Publisher 30 Jun. 1986).

F. C. T. So, X. A. Zhao, E. Kolawa, J. L. Tandon, M. F. Zhu, and M. A. Nicolet, "Amorphous W-Zr Films as Diffusion Barriers between Al and Si", *Mat. Res. Soc. Symp. Proc.*, vol. 54, pp. 139-145 (1986) (one of the Authors here is from California Institute of Technology, Pasadena, Calif. 91125). The date of this Publication, this Symposium, or the Government Contracts Report referred to in this paper are not known nor is it known whether there were any prior reports under the Government Contracts cited in this paper as supporting the work reported in this paper.

M. F. Zhu, F. C. T. So and M. A. Nicolet, *Thin Solid Films, 130* (1985). On page 144 of the So et al. paper on "Amorphous W-Zr Films as Diffusion Barriers between Al and Si", the authors state Previous investigations indicate that a reduction of reactivity between Al and amorphous Ni-W [26] alloy or W [27] can be achieved by intentional incorporation of nitrogen into the barrier layer during sputter deposition.

F. W. Saris, L. S. Hung, M. Nastasi and J. W. Mayer, "Stability of Thin Film Amorphous Metal Alloys", *Mat. Res. Soc. Symp. Proc.*, vol. 54, pp. 81-89 (1986). (The precise date of publication or the symposium at which this publication was presented is not known, other than sometime in 1986.) However, Hung, Nastasi and Mayer are listed as being from the Department of Materials Science and Engineering, Cornell University, Ithaca, N.Y. 14853, USA.

R. E. Thomas, J. H. Perepezko, and J. D. Wiley, "Interfacial Reactions Between Amorphous W-Si Thin Films and Polycrystalline Overlayers", *Mat Res. Soc. Symp. Proc.*, vol. 54, (1986 Materials Research Society). It is not known what month this paper was presented or published.

B. L. Doyle et al., "Atomic Interdiffusion in Au/amorphous Ni-Nb/Semiconductor Systems", *Thin Solid films*, vol. 104, pp. 69-79 (1983).

K. J. Guo et al., "Amorphous Metal Diffusion Barriers", *Proc. 2nd Conf. on High Temperature Electronics and Instrumentation*, (Houston, Texas, USA Dec., 7-8, 1981.

Gregg Kelly et al., "Packaging Electronics for Reliability", *Automotive Engineering*, pp. 29-31 (Sep. 1992).

Raymond Edward Thomas, *Reactions between Amorphous W-Si Thin Films and Polycrystalline (metal) Overlayers*, Doctoral Dissertation at University of Wisconsin, Section 2.2 "Literature Review on Reactions Involving Amorphous Metal Thin Films", pp. 19-25 and Section 5 Interactions Between Amorphous W-Si and Polycrystalline Al Overlayers, pp. 115 and 151-153 (1987).

Wiley et al., "High Temperature Metallization System for Solar Cells and Geothermal Probes", *Sandia National Laboratories Report No. SAND80-7167 (UC63e)* on work done Jan. 1, 1980 through Sep. 30, 1980 under Sandia Contract 49-1664 High Temperature Metallization System for Solar Cells and Semiconducting Devices for Geothermal Probes.

J. D. Wiley et al., "Amorphous Metallizations for High-Temperature Semiconductor Device Applications", *IEEE Transactions on Industrial Electronics*, vIE-29, No. 2, pp. 154-157 (May 1982).

"Amorphous Ni-N-W Film As a Diffusion Barrier Between Aluminum and Silicon"—Zhu et al—Thin Solid Films (1985) pp. 245-251.

"Amorphous Metallic Alloys in Semiconductor Contact Metallizations"—Nicolet et al—Solid State Technology/Dec. 1983. pp. 129-133.

MULTILAYER METALLIZATION FOR SILICON SEMICONDUCTOR DEVICES INCLUDING A DIFFUSION BARRIER FORMED OF AMORPHOUS TUNGSTEN/SILICON

BACKGROUND OF THE INVENTION

1. Field of the Invention

This invention relates to a multilayer metallization system for silicon integrated circuits. This invention more particularly relates to an improved multilayer metallization system that includes an aluminum-silicon alloy.

2. Description of the Prior Art

Aluminum or aluminum alloys are widely used as a single layer metallization for many silicon semiconductor devices, especially integrated circuits. However, an aluminum-containing single layer metallization limits use of a silicon semiconductor device to low and moderate temperature processing conditions and product applications. Higher temperatures cannot be used because aluminum and silicon interdiffuse at elevated temperatures. On extended exposure to higher temperatures, aluminum-silicon interdiffusion and/or silicon precipitation can cause serious degradation of an aluminum-containing metallization layer on a silicon integrated circuit (IC). Unanticipated contact resistances can result. The unanticipated resistances may not allow the associated circuitry to function as designed. It may not even function at all. In any event the problem and its effects are well known, and need not be discussed further here.

Perepezko et al., in their U.S. Pat. Nos. 4,350,994 and 4,494,136, expressly recognize the aluminum/silicon interdiffusion problem. They disclose substituting another metal for aluminum in the metallization pattern. More specifically, they disclose replacing aluminum with a layer of an amorphous refractory conductive material. The amorphous refractory conductive material can be a metal, or a compound or alloy of high-temperature metals and/or metalloids.

Perepezko et al. disclose that the amorphous materials they contemplate do not interdiffuse with silicon, so long as the amorphous materials remain in their amorphous state. Hence, the amorphous state of the material acts as a diffusion barrier to silicon.

Perepezko et al. teach that an amorphous material will transform into a crystalline material upon being heated. The particular temperature at which this occurs is referred to herein as the crystallization temperature. Perepezko et al. also teach that crystallization temperature of refractory materials is higher, and highest for eutectics of refractory materials. Hence, eutectic refractory compositions are preferred.

Perepezko et al. point out that the search for appropriate metallization materials is largely empirical because there is no way to predict, a priori, whether a given metal will form a good quality ohmic or Schottky contact with a given semiconductor.

We agree. In fact, amorphous refractory materials, alone, do not make commercially satisfactory metallization layers. Our experience has shown that their specific conductivity is too low. In U.S. Pat. No. 4,965,656, Koubuchi et al. solve this problem by also using an aluminum layer, over the amorphous layer.

In other words, Koubuchi et al. interpose Perepezko et al.'s amorphous barrier layer between the silicon IC surface and the aluminum metallization layer. Koubuchi et al., like Perepezko et al., are intended to prevent silicon/aluminum interdiffusion. They both describe a wide variety of amorphous refractory metal/metalloids that can might be useful, and that eutectic compositions are preferred.

More specifically, Koubuchi et also state that the aluminum/silicon interdiffusion is a processing problem, not an operational problem. Koubuchi et al. state that detrimental interdiffusion can occur due to heating during fabrication steps following device metallization. We are aware of this problem. However, we recognize a different problem. It occurs if the aluminum metallization layer contains silicon, and it frequently does.

A frequently used aluminum metallization alloy contains 1% silicon and 1% copper, by weight and the balance aluminum. This relatively minor proportion of silicon is used to prevent "spiking" of the aluminum on a silicon IC surface. However, it is also enough to cause the "different" problem referred to above. With such aluminum/silicon alloys, post-metallization heat treatments can cause high resistance silicon precipitate formations to preferentially deposit in the metallization layer in the contact window. These preferential formations are caused by segregation of silicon atoms in the aluminum alloy. These preferential formations also occur in the metallization layer at steps in an underlying dielectric coating. Hence, silicon precipitation is not an interdiffusion problem.

In the past, the high resistance silicon precipitate formations did not pose a serious problem. This is because IC metallization contact sizes were greater than about 1.5 microns. This is fairly large compared to the size of the silicon precipitate formations. In such larger contact size ICs, the silicon precipitate formations occupied only a minor proportion of any given contact area. With IC metallization feature sizes of about 1 micron or less, we find such precipitate formations can occupy a sizable proportion of a contact area. The proportion is enough to raise contact resistance to an objectionable level. Such an occurrence at even one contact area in an IC can cause the IC to no longer perform as intended.

One might think that the solution is to simply reduce or eliminate silicon content of the aluminum alloy. The answer is not that simple. About 1% silicon is desired in an aluminum metallization alloy to avoid spiking when used on a silicon surface. It may also be included to preclude unintended interactions with other substances contacted on the silicon surface. Also, commercial manufacturers may want to use a silicon containing alloy in fine geometry applications for practical reasons. They may have large and small feature size applications and may want to use only one alloy in their facility, and/or they find comfort in using an alloy that is familiar to them. Some manufacturers may even perceive incidental other benefits in using silicon in the aluminum alloy. For such commercial manufacturers, deleting the silicon content from the metallization aluminum alloy is not a preferred choice. In this invention, we firstly solve the aluminum/silicon interdiffusion problem with a particularly effective diffusion barrier. The barrier is amorphous tungsten/silicon. In addition, silicon precipitates do not preferentially form in the contact windows when such a layer is deposited on an amorphous tungsten/silicon layer. Hence, use of the amorphous tungsten silicon also solves the silicon precipitate formation problem. Neither Perepezko et al. nor Koubuchi et al.

teach that amorphous tungsten/silicon is special for either purpose in an aluminum metallization system.

On the other hand, our particularly effective amorphous tungsten/silicon material has a problem of its own. It has contact resistance problems with P-type silicon. Amorphous tungsten/silicon has good adhesion to silicon. Accordingly, it should be expected to have low contact resistance with silicon. However, in this invention, we discovered that amorphous tungsten/silicon does not consistently make good contacts to P-type silicon. Silicon integrated circuits usually have both P-type and N-type regions that must be contacted by the metallization. If low resistance contacts cannot be predictably made to all of these regions consistently, the metallization system is unsatisfactory. This invention solves the contact resistance problem of amorphous tungsten/silicon on P-type silicon by interposing an additional layer under the amorphous tungsten/silicon. Our additional layer is thus important to effective utilization of amorphous tungsten/silicon, and will hereinafter be described.

Our invention therefore provides a means for commercially using a highly effective aluminum/silicon diffusion barrier in an aluminum-containing metallization system. Thus, one preserves the option to use of an aluminum-type of system, which is well understood. Still further, our diffusion barrier material also suppresses formation of the objectionable silicon precipitation on aluminum alloy containing silicon. Thus, one can still use the familiar metallization aluminum alloy that contain silicon in current small feature size applications. In addition, an important ancillary benefit results from using an amorphous tungsten/silicon layer as the barrier layer. It is so effective as a barrier layer that it can be used in extremely thin films, which can reduce the overall thickness of the metallization layer. Minimizing the overall thickness of a metallization layer reduces step-height at the edges of the layer. This is important in obtaining most effective coverage of subsequently applied coatings, especially if such coatings are part of a multilevel metallization.

SUMMARY OF THE INVENTION

This invention comprises a trilayer metallization system for silicon devices, especially integrated circuits.

This invention teaches that amorphous tungsten/silicon is an especially highly effective barrier to aluminum/silicon interdiffusion.

This invention allows aluminum alloys containing silicon to be used for small feature size metallization applications.

This invention permits use of an extremely thin barrier layer under an aluminum-containing metallization layer for both P-type and N-type silicon regions. This invention achieves its benefits by means of a metallization system that comprises an initial titanium or silicide layer, an amorphous tungsten/silicon layer, and an aluminum or aluminum alloy over-layer. The aluminum alloy over-layer preferably is a silicon-containing aluminum alloy.

BRIEF DESCRIPTION OF THE DRAWING

The drawing shows a cross-sectional view through a surface portion of a silicon integrated circuit having a trilayer metallization system of this invention. Contacts are shown to both a P-type conductivity silicon region and an N-type conductivity silicon region.

DESCRIPTION OF THE PREFERRED EMBODIMENTS

Figure 1:
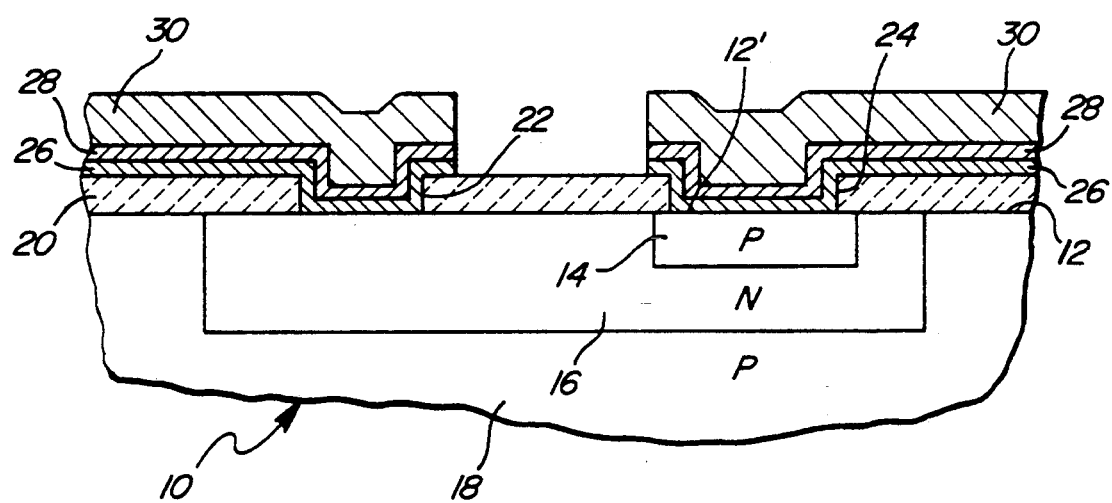

The deposition steps of this invention are easily integrated into existing commercially used aluminum alloy metallization processes. No significant changes in aluminum deposition are required, and no different, or even additional, equipment is necessarily needed. Accordingly, our new metallization system is attractive for commercial use. Its attraction is not limited to use on only integrated circuits intended for higher temperature operation. The metallization system of this invention is attractive for use in small feature size silicon IC applications with any aluminum alloy but especially with aluminum alloys containing silicon.

As hereinbefore mentioned, in this invention it was found that amorphous tungsten/silicon does not consistently and reliably make low resistance contacts to P-type silicon. This is a very important factor that could preclude commercial use of an amorphous tungsten/silicon diffusion barrier layer under an aluminum layer.

In this invention a three-layer metallization system is provided in which a titanium or silicide layer is disposed on a silicon surface, at least on its P-type regions. The titanium or silicide layer consistently makes low resistance contacts to both P-type and N-type silicon. In addition, the titanium or silicide contacts are highly adherent to silicon. Hence, they are durable low resistance contacts.

It has been found that amorphous tungsten/silicon adheres quite well to a titanium or silicide layer on silicon. Moreover, amorphous tungsten/silicon consistently makes low resistance electrical contact with titanium or silicide layers that overlie both P-type and N-type silicon regions. In addition, amorphous tungsten/silicon makes adherent and low resistance contact to an overlying aluminum or aluminum alloy metallization layer, particularly aluminum alloys containing silicon.

Reference is now made to the drawing which shows a cross-sectional view through a surface portion of a silicon integrated circuit chip 10. Surface 12 of silicon integrated circuit 10 has an island-like P-type region 14 inset in an island-like N-type region 16. Island region 16 is, in turn, inset in a P-type surface portion 18 of the silicon integrated circuit 10. In this example, the bulk of the silicon integrated circuit chip 10 would be of P conductivity type as well. A blanket silicon oxide coating 20 is disposed on silicon surface 12. A first aperture 22 in the silicon oxide coating 20 is disposed over a portion of N-type island-like region 16 that is laterally disposed from P-type island-like region 14. A second aperture 24 in silicon oxide coating 20 is disposed directly over P-type island-like region 14, and is wholly within the periphery of p-type island-like region 14.

A three-layer metallization pattern is disposed on the silicon oxide coating 20. One portion of the metallization pattern contacts the silicon surface portion 12' exposed within aperture 22. A second portion contacts the silicon surface portion 12' exposed within aperture 24. The three-layer metallization comprises an initial or lower layer of titanium that is about 300–500 angstroms thick. A second, or middle, layer 28 of amorphous tungsten/silicon is disposed on titanium layer 26. The amorphous tungsten/silicon layer 28 contains approximately 75 atomic percent tungsten and 25 atomic percent silicon. The amorphous tungsten/silicon layer 28 is about 300–500 angstroms thick. A relatively thick layer 30 of an aluminum alloy is disposed on the amorphous tungsten/silicon layer 28. The aluminum alloy layer 30 contains, by weight, about 98 percent aluminum, 1 percent copper and 1 percent silicon, and is approximately 5,000–6,000 angstroms thick.

In addition to what is shown in the drawing, an actual silicon integrated circuit device might have an antireflective coating and a passivation coating on top of the metallization. Analogously, an actual silicon integrated circuit device might have a surface smoothing phosphosilicate glass coating between the metallization layer and the underlying silicon oxide layer. These coatings are not shown in the drawing because the drawing is intended to focus attention on the three layer metallization system of the invention. The other coatings form no part of this invention.

As indicated above, titanium layer 26 is present because it makes low resistance contact to both silicon and the amorphous tungsten/silicon layer. Extremely thin titanium films can be used. The reason is that there is essentially no interdiffusion between silicon and titanium after deposition. Even thin films remain stable after extended periods of time at elevated temperature. Accordingly, there appears to be no benefit, only possible objections, to using appreciably thicker films of titanium than those hereinbefore described. Essentially, the titanium film needs to only be thick enough to form a continuous film. In our experience about 300 angstroms is needed to ordinarily obtain a continuous film. A thickness of 500 angstroms provides greater assurance that the titanium film is continuous, and does not provide a significant increase in metallization stepheight. Thus, a thickness of approximately 300–500 angstroms is preferred. However, we believe that it is not particularly objectionable to use thickness up to about 1,000 angstroms.

We prefer to avoid thicknesses in excess of about 1,000 angstroms. Thicknesses over about 1,000 angstroms may introduce undesirable series resistance into the metallization system. Also, it may tend to introduce undesirable stress in the titanium deposit, which can deleteriously affect adhesion of the titanium to the silicon. Further, we generally prefer to use lesser thickness, if possible, to keep the overall thickness of the metallization system low. This not only tends to reduce an undesirable stress build-up, but also tends to keep the metallization layer step-height to a minimum. This helps in obtaining better coverage of any subsequently applied coatings. Keeping step-height low is particularly important if one is going to subsequently apply a dielectric coating and then a second level metallization coating.

Titanium is particularly useful for initial metal layer 26. Not only does it have low contact resistance with silicon and amorphous tungsten/silicon but it also is a metal film with which commercial manufacturers are already acquainted. They have used it to promote adhesion between non-adhering materials. In this invention, adhesion is not an issue. On the other hand, commercial familiarity with the use of titanium films, makes its use in this invention more commercially beneficial.

On the other hand, we have also found that platinum silicide makes an adherent and low resistance contact to both P-type and N-type silicon, and to amorphous tungsten/silicon. Platinum silicide is a generally stable film and is a material familiar no commercial semiconductor manufacturing. Accordingly, it is an attractive alternate to, but not necessarily preferred over, titanium for layer 26 in this invention. It is expected that some other silicides might work but would not be as commercially attractive. In particular, tantalum silicide and molybdenum silicide should be useful. While not as preferred as a titanium layer, a layer of a silicide of many transition metals might be useful. By transition metals, we mean metals of atomic numbers 21–29, 39–47, 57–79, and greater than 88. We are not aware of any other materials that might effectively and consistently reduce contact resistance between P-type silicon surface 12 and the amorphous tungsten/silicon layer 28, and otherwise be useful in this invention.

It appears that an amorphous tungsten/silicon film exhibits no measurable interdiffusion with silicon or with aluminum after long term exposure to elevated temperatures. Accordingly, amorphous tungsten/silicon is very stable. Even very thin films of amorphous tungsten/silicon will act as a diffusion barrier between an overlying aluminum coating and an underlying silicon surface. It appears that if an amorphous tungsten/silicon film is continuous as formed, it will act as an effective diffusion barrier between silicon and aluminum.

Our experience has demonstrated that we can consistently form effective diffusion barriers in amorphous tungsten/silicon layer 28 with continuous films having thicknesses of only 300–500 angstroms. Accordingly, our preferred thickness for layer 28 would essentially be the same as for titanium layer 26. It is conceivable that someone might want to use thicker layers of amorphous tungsten/silicon. However, we would prefer to avoid using amorphous tungsten/silicon layers thicker than about 1,000 angstroms for many of the same reasons hereinbefore-mentioned for titanium layer 26. In summary, thicker coatings provide higher series resistance, and may induce stresses which could deleteriously affect adhesion. We, of course, prefer to avoid that. Still further, we see considerable advantage in keeping the overall thickness of the metallization layer as small as practical, to keep metallization "step-height" low.

Like Perepezko et al. and Koubuchi et al., we prefer to use eutectic proportions, or-close to eutectic proportions, of tungsten and silicon in our amorphous tungsten/silicon barrier material. These proportions produce the highest temperature at which the our amorphous material changes from amorphous state into a crystalline state. We refer to temperature at which this change occurs as a transition temperature, or a crystallization temperature. By eutectic proportions, we mean about 75 atomic percent tungsten and 25 atomic percent silicon. By close to eutectic, we mean about 72–78 atomic percent tungsten and 23–28 atomic percent silicon.

Other proportions of tungsten and silicon in our amorphous tungsten/silicon layer have been used effectively too. Compositions of 65 atomic percent tungsten and 35 percent silicon have been effective. On the other hand, substantially higher tungsten proportions than eutectic proportions have been used. It appears that tungsten proportions in excess of 90 atomic percent can even provide some benefit if they can be deposited as amorphous coatings. It must be appreciated though, that the farther one departs from the eutectic composition the lower the temperature at which the diffusion barrier is still effective. Accordingly, we would ordinarily not prefer them.

Our amorphous materials can be deposited by any convenient technique. Perepezko et al. and Koubuchi et al. teach such deposition processes, and their teachings are incorporated herein by reference. One technique that can be used is to sputter deposit the coating in such a manner that it is amorphous as-deposited.

We prefer that aluminum layer 30 generally have a thickness of about 5,000–6,000 angstroms. However, we recognize that some manufacturers routinely use a thickness of 8,000–10,000 angstroms. We also recognize that there are applications where it is desirable that aluminum layer 30 have a thickness of up to about 20,000 angstroms. The latter extreme thicknesses may be desired for integrated circuits having a single level of metallization and which are to be designed to handle relatively high currents. Aluminum layers are rather ductile. For this reason, relatively large thicknesses of aluminum do not build up as much stress in the metallization layer. On the other hand, as indicated above, one always would like to keep step-height as low as is practical for any given application. Lower step-heights in the metallization make coverage of subsequently applied layers much more uniform.

As indicated above, other coatings are usually applied over the aluminum layer 30, even in single level metallizations. For example, an over-layer (not shown) of silicon nitride might be used as a passivation layer. If a second level of metallization is to be applied, as in a dual layer metallization there will be several more coating layers applied. Step-height can become very important indeed.

As indicated above, aluminum layer 30 might be pure aluminum. However, we prefer an aluminum alloy. We especially prefer to use an aluminum alloy that can be used in other silicon device metallizations as well. We recognize that most commercial manufacturers have their own preferences as to which semiconductor grade aluminum alloy they use. We believe that the benefits of this invention can be realized with all aluminum metallization alloys that are useful in semiconductor applications, especially aluminum alloys containing silicon. It should also be recognized that the metallization system of this invention is most important for use as the first level metallization in a dual level metallization system. On the other hand, a semiconductor manufacturer may prefer to have only one metallization system in production use. Accordingly, our metallization system may also be preferred for second level of a dual level metallization system. For an analogous reason, it may also be preferred for silicon device applications where aluminum/silicon interdiffusion and/or silicon segregation is not objectionable. Along this line, it may be preferred to use an aluminum alloy without silicon as the top layer in this invention. For example, no significant benefit is using silicon in the alloy may be recognized, there may be no desire to use only one aluminum alloy for metallizations, and/or there may be no other metallization applications.

What is claimed:

1. A metallization system suitable for silicon integrated circuits, which metallization system consistently exhibits low contact resistance in contracting P-type silicon surface regions, as well as N-type silicon surface regions, said metallization system comprising:
   an initial layer of a conductor selected from the group consisting of titanium, platinum silicide, tantalum silicide, and molybdenum silicide on the surface of a P-type contact region in a silicon substrate;
   a middle layer of amorphous tungsten/silicon on the initial layer, said amorphous tungsten/silicon middle layer having an amorphous to crystalline transition temperature; and
   an overlayer of a member selected from the group consisting of aluminum and aluminum alloys on the amorphous tungsten/silicon middle layer,
   effective to produce a metallization system that consistently provides adherent, low electrical resistance contacts on P-type silicon, as well as on N-type silicon.

2. A three layer aluminum-type metallization system for silicon integrated circuits that consistently exhibits low contact resistance in contacting P-type silicon regions, which metallization system comprises:
   a first layer of a material selected from the group consisting of titanium and platinum silicide on the surface of a P-type contact region in a silicon substrate, which layer has low contact resistance to P-type silicon, low contact resistance to a subsequently applied amorphous tungsten/silicon layer, and good adhesion to both;
   a second layer of amorphous tungsten/silicon on the first layer to prevent interdiffusion between the silicon substrate and an overlying layer that contains aluminum; and
   a third and relatively thicker layer, of an aluminum alloy containing silicon on the amorphous tungsten/silicon second layer and providing low electrical resistance lateral conductivity,
   effective to produce a metallization system that consistently provides adherent, low electrical resistance contacts on P-type silicon, as well as on N-type silicon, and such contacts exhibit enhanced thermal stability over a contact of such aluminum alloy directly on a silicon surface.

3. A metallization system as recited in claim 2 wherein the first and second layers have a thickness not substantially greater than about 1,000 angstroms and the third layer has a thickness not substantially greater than about 20,000 angstroms.

4. A metallization system as recited in claim 2 wherein the first layer is titanium.

5. A metallization system as recited in claim 2 wherein the first layer is platinum silicide.

6. A three layer aluminum-type metallization system for silicon integrated circuits that consistently exhibits low contact resistance in contacting P-type silicon regions, which metallization system comprises:
   a first layer of a material selected from the group consisting of titanium and transition metal silicides on the surface of a P-type contact region in a silicon substrate, which layer has low contact resistance to P-type silicon, low contact resistance to a subsequently applied amorphous tungsten/silicon layer, and good adhesion to both;
   a second layer of amorphous tungsten/silicon on the first layer to prevent interdiffusion between the silicon substrate and an overlying layer that contains aluminum, wherein the proportions of the tungsten and silicon in the amorphous tungsten/silicon second layer are substantially eutectic proportions; and,
   a third and relatively thicker layer, of an aluminum alloy containing silicon on the amorphous tungsten/silicon second layer and providing low electrical resistance lateral conductivity,
   effective to produce a metallization system that consistently provides adherent, low electrical resistance contacts on P-type silicon, as well as on N- type silicon, and such contacts exhibit enhanced thermal stability over a contact of such aluminum alloy directly on a silicon surface.

7. A three layer aluminum-type metallization system for silicon integrated circuits that consistently exhibits low contact resistance in contacting P-type silicon regions, which metallization system comprises:
- a first layer of a material selected from the group consisting of titanium and transition metal silicides on the surface of a P-type contact region in a silicon substrate, which layer has low contact resistance to P-type silicon, low contact resistance to a subsequently applied amorphous tungsten/silicon layer, and good adhesion to both;
- a second layer of amorphous tungsten/silicon on the first layer to prevent interdiffusion between the silicon substrate and an overlying layer that contains aluminum;
- wherein the first and second layers are each no greater than about 500 angstroms thick and the proportions of the tungsten and silicon in the amorphous tungsten/silicon second layer are substantially eutectic proportions; and
- a third and relatively thicker layer, of an aluminum alloy containing silicon on the amorphous tungsten/silicon second layer and providing low electrical resistance lateral conductivity,
- effective to produce a metallization system that consistently provides adherent, low electrical resistance contacts on P-type silicon, as well as on N-type silicon, and such contacts exhibit enhanced thermal stability over a contact of such aluminum alloy directly on a silicon surface.

* * * * *